United States Patent [19]

Tomino et al.

[11] Patent Number: 4,740,165

[45] Date of Patent: * Apr. 26, 1988

[54] ELECTRONIC ASSEMBLY INCLUDING INTEGRATED CIRCUIT PACKAGE AND LIQUID CRYSTAL DISPLAY PANEL

[75] Inventors: Tadashi Tomino, Yamatokoriyama; Masayuki Higuchi, Ueno, both of Japan

[73] Assignee: Sharp Kabushiki Kaisha, Osaka, Japan

[*] Notice: The portion of the term of this patent subsequent to Apr. 2, 2002 has been disclaimed.

[21] Appl. No.: 834,411

[22] Filed: Feb. 28, 1986

Related U.S. Application Data

[60] Division of Ser. No. 632,038, Jul. 18, 1984, Pat. No. 4,627,676, which is a continuation of Ser. No. 349,925, Feb. 18, 1982, Pat. No. 4,508,402.

[30] Foreign Application Priority Data

Feb. 27, 1981 [JP] Japan .................................. 56-29250
Apr. 9, 1981 [JP] Japan .................................. 56-54066
Sep. 30, 1981 [JP] Japan .................................. 56-157151

[51] Int. Cl.$^4$ .............................................. H01R 9/09
[52] U.S. Cl. ........................................ 439/67; 439/68; 340/711
[58] Field of Search ............. 339/17 CF, 17 F, 17 R; 361/398; 340/711; 439/67-73

[56] References Cited

U.S. PATENT DOCUMENTS

| | | | |
|---|---|---|---|
| 3,614,832 | 10/1971 | Chance et al. | 174/52 FP |
| 3,746,157 | 7/1973 | I'Anson | 339/17 CF |
| 3,771,109 | 11/1973 | Bruckner et al. | 339/17 CF |
| 3,965,665 | 6/1976 | Somogyi | 339/256 R |
| 4,169,642 | 10/1979 | Mouissie | 339/17 CF |
| 4,357,061 | 11/1982 | Crosby | 339/17 C |
| 4,508,402 | 4/1985 | Tomino et al. | 339/17 R |

Primary Examiner—Neil Abrams
Attorney, Agent, or Firm—Birch, Stewart, Kolasch & Birch

[57] ABSTRACT

There is disclosed an electronic assembly for use in calculators, watches and so forth. The assembly includes an integrated circuit element having a plurality of positioning apertures at the periphery thereof and a circuit board (preferably, a flexible circuit film) having a plurality of terminals to be electrically connected to the respective terminals of the integrated circuit element and also having a plurality of positioning apertures. The assembly further includes an upper casing and a lower casing one of which has a plurality of positioning projections to be received within the positioning apertures in the circuit element and a plurality of positioning projections to be received within the positioning apertures in the circuit board, for determining relative position of the integrated circuit element and the circuit board with respect to the casing. Preferably, the integrated circuit element has a plurality of signal terminals extending from one side and one or more power terminals extending from a second side thereof and in a direction different from that of the signal terminals, with the latter in direct contact with battery terminals when the assembly is completed. The package of the integrated circuit element may be of a polygonal configuration including a pentagon or more and the whole of the integrated circuit element including the power terminals shaped substantially into a rectangle.

9 Claims, 6 Drawing Sheets

ELECTRONIC ASSEMBLY INCLUDING INTEGRATED CIRCUIT PACKAGE AND LIQUID CRYSTAL DISPLAY PANEL

This application is a division of application Ser. No. 632,038 filed July 18, 1984, now U.S. Pat. No. 4,627,676 which is a continuation of application Ser. No. 349,925 filed on Feb. 18, 1982, now U.S. Pat. No. 4,508,402.

BACKGROUND OF THE INVENTION

This invention relates to an electronic assembly including an integrated circuit package and more particularly it relates to an electronic assembly including an integrated circuit package, a liquid crystal display panel and a keyboard, for example, hand-held calculators, clocks and watches.

An integrated circuit package has a number of terminals for electric connection. It is conventional to connect these terminal of the integrated circuit package to the corresponding terminals of a printed circuit board, individually, by soldering. The prior art demands accurate placement of the terminals of the integrated circuit packages with regard to the printed circuit board and misalignment leads to wrong connections between the terminals of the integrated circuit package and those on the printed circuit board. Therefore, a positioning jig or jigs are used in connecting these terminals and thus productivity is unsatisfactory. In the case where an electronic assembly includes a liquid crystal display panel and a keyboard in addition to the the integrated circuit package, for example, hand-held calculators, clocks and watches, a more complex procedure of assembling is necessary.

OBJECT AND SUMMARY OF THE INVENTION

Accordingly, it is an object of the present invention to provide an assembly wherein an integrated circuit package or chip may be easily, but accurately, positioned with respect to a support member in a manner to enhance high productivity.

Pursuant to the present invention, the above object is achieved by providing an assembly which comprises an integrated circuit element having a first engaging means with terminals or a package thereof and a support on which the integrated circuit element is secured, the support having a second engaging means engageable with the first engaging means of the integrated circuit element for determining the relative position of the integrated circuit element with respect to the support, wherein the terminals of the integrated circuit element are prevented from shifting from corresponding terminals so as to be electrically connected therewith while the first and second engaging means are in an engaging relationship.

Preferably, the first engaging means of the integrated circuit element includes a plurality of positioning openings formed in the package thereof especially in a lead-in frame to help the positioning of the integrated circuit element. It is also desirable for the integrated circuit element to have a plurality of signal terminals extending from its one side and one or more power terminals extending from a second side thereof and in a direction different from that of the signal terminals, with the latter in direct contact with battery terminals when the assembly is completed. This arrangment offers the advantageous feature that electrode and circuit patterns may be simplified due to the distinctive lay-out and the contact resistance at the power terminals may be kept as low as possible when the integrated circuit element is actually mounted by pressure bonding.

In another aspect of the present invention, the package of the integrated circuit element is of a polygonal configuration including a pentagon or more and the whole of the integrated circuit element including the power terminals are shaped substantially into a rectangle. With this configuration, the power terminals may be wide enough for its purpose and the whole of the integrated circuit element will have no protruding parts and be capable of withstanding mechanical shock. Further, the integrated circuit element is more desirable for automated assembling.

BRIEF DESCRIPTION OF THE DRAWINGS

For a more complete understanding of the present invention and for further objects and advantages therof, reference is now made to the following description taken in conjunction with the accompanying drawings, in which.

DETAILED DESCRIPTION OF THE INVENTION

Figure 1:
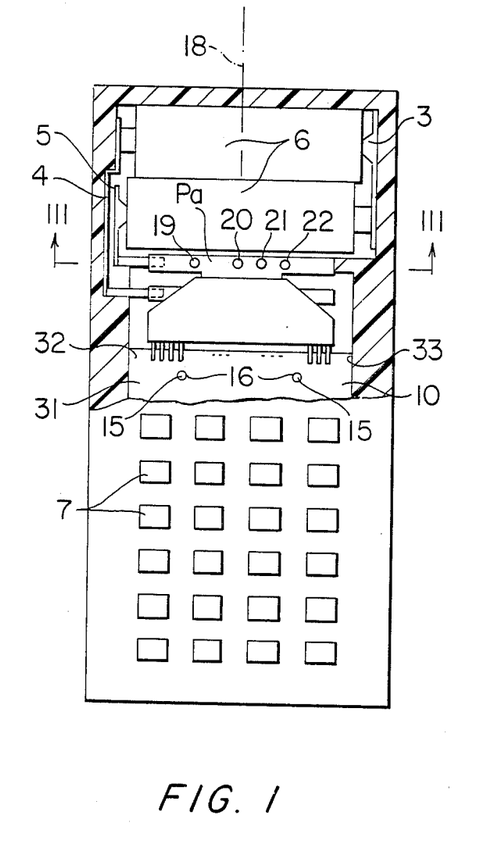
FIG. 1 is a fragmentary cross sectional front view of an embodiment of the present invention.
Figure 2:
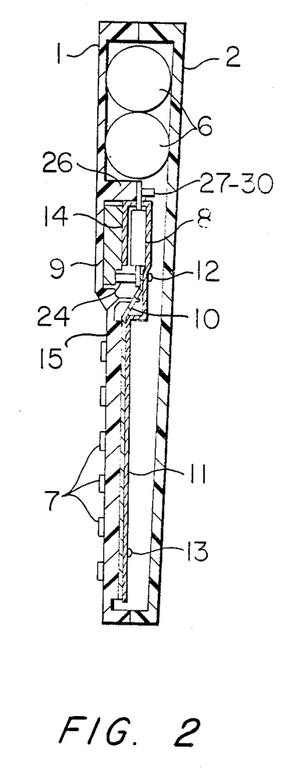
FIG. 2 is a longitudinal cross sectional view of the above illustrated embodiment.
Figure 3:
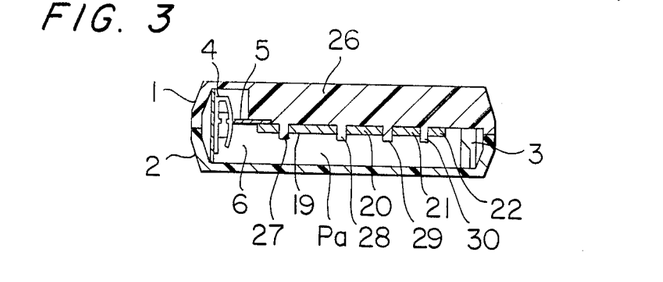
FIG. 3 is a cross sectional view taken on the line III—III in FIG. 1.

FIG. 1 is a fragmentary cross sectional front view of an embodiment of the present invention, FIG. 2 is a longitudinal cross sectional view of the embodiment as shown in FIG. 1 and FIG. 3 is a simplified cross sectional view taken on the line III—III in FIG. 1. A calculator illustrated herein includes a top casing 1 and a bottom casing 2. The top casing 1 receives a battery or batteries 6 held by battery terminals 3, 4 and 5. Power supply from the battery or batteries 6 energizes an integrated circuit element 8 for performing arithmetic operations on signals introduced via push buttons 7 on a keyboard and a display 9 typically a liquid crystal display panel for displaying the results of the operations. A printed circuit film 10 is disposed behind the push buttons and supported by means of a rigid press member 11. Upon actuation of one of the push buttons 7 the corresponding key electrode on the film 10 becomes operative to feed a signal to the integrated circuit element 8.

Figure 4:
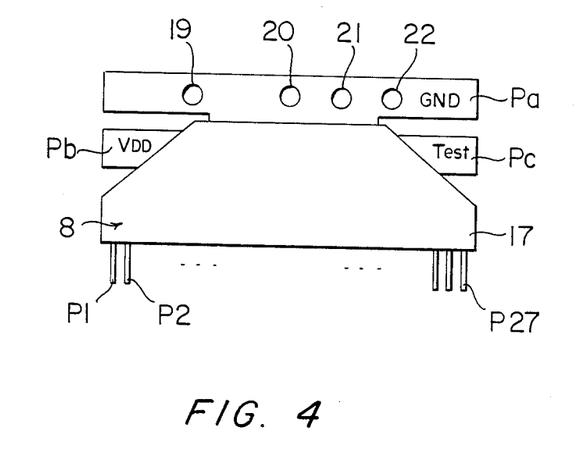
FIG. 4 is a plan view of an integrated circuit element.
Figure 5:
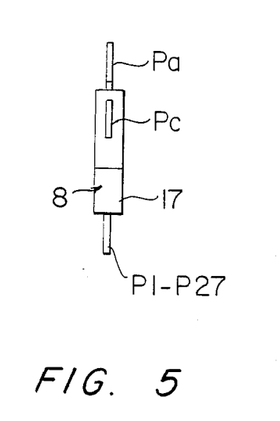
FIG. 5 is a right side view of the integrated circuit element.
Figure 6:
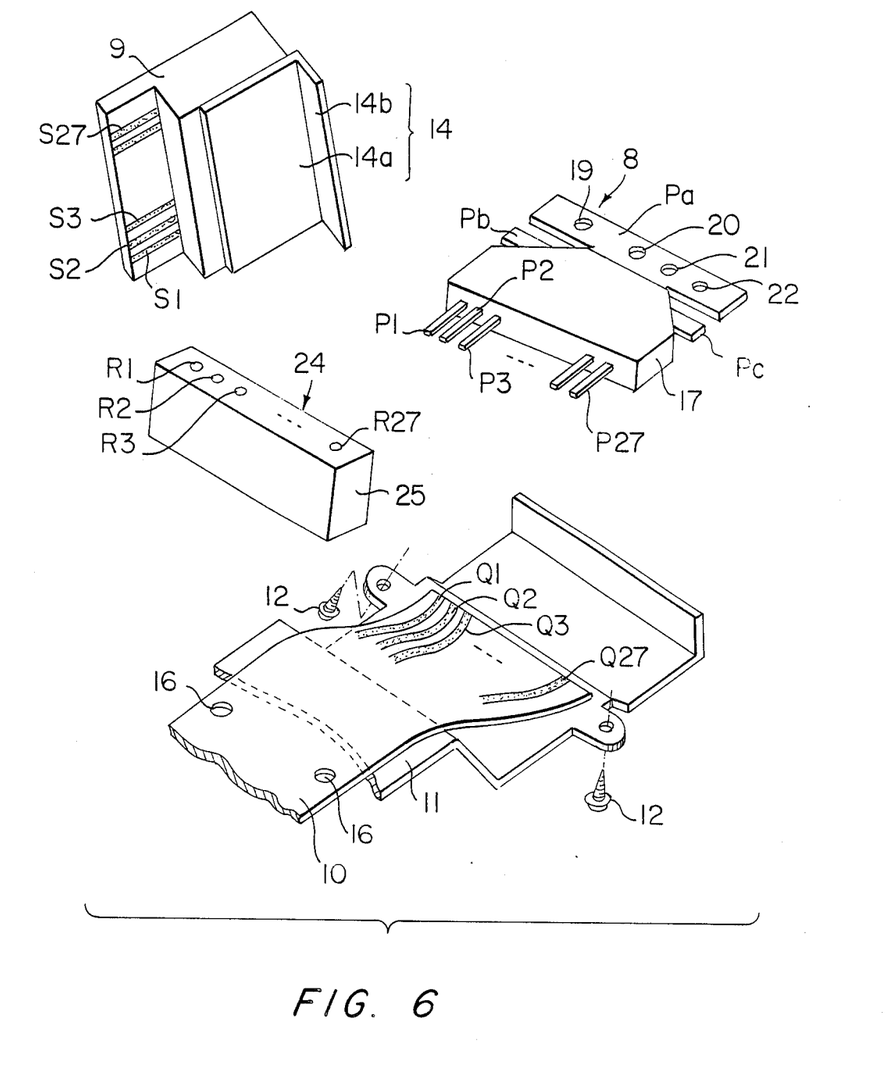
FIG. 6 is an exploded view of the integrated circuit element and peripheral elements.

FIG. 4 is a plan view of the integrated circuit element 8. FIG. 5 is a right side view of the integrated circuit element 8 and FIG. 6 is an exploded view of the integrated circuit element 8 and peripheral elements. On the film 10 there are formed terminals Q1-Q27 in juxtaposition which are to be connected to signal terminals P1–P27 on a package 17 of the integrated circuit element 8. The press member 11 is fixedly secured on the top casing 1 by means of screws 12 and 13. The film 10 seated on the press member 11 has two positioning openings 16 in which two positioning projections 15 on the top casing 1 are received respectively. This aids in fixing the relative position between the film 10 having the terminals Q1–Q27 and the top casing 1. Even though the film 10 becomes bent, the terminals P1–P27 and Q1–Q27 never move along the width thereof (that is, left or right in FIG. 1).

The package 17 of the integrated circuit element 8 has a power terminal Pa extending throughout the width of the package 17 and on the side thereof opposite the signal terminals P1–P27. The terminal Pa has a plurality (in the given example, four) of engaging openings 19–22 asymmetric with regard to the center line 18 of the calculator. The openings 19–22 correspond to and engage with respectively four engaging projections 27–30 formed on a mounting 26 on the top of casing 1.

On two opposite sides of the package 17 there are respectively installed an additional power terminal Pb and a test terminal Pc for checkup of the integrated circuit element 8. These terminals P1–P27, Pa, Pb and Pc are rigid. The reason why the engaging openings 19–22 and the engaging projections 27–30 are arranged asymmetrically with respect to the center line 18 is to prevent the package 17 from being mounted on the top casing 1 with the top down and the terminals thereon from being connected to wrong positions. The engaging relationship between the openings 19–22 and the projections 27–30 determines and fixes the relative position between the integrated circuit element 8 and the top casing 1 in the sideward direction in FIG. 1. The respective terminals P1–P27 of the integrated circuit element 8 are therefore held in tight contact with the lead-out terminals Q1–Q27 on the circuit film 10 seated on the press member 11. The power terminal Pa, when resting on the mounting 26, is held in contact with the battery terminal 5. When this occurs, the other power terminal Pb contacts the battery terminal 4.

A connector 24 is mounted on the terminals P1–P27, which is comprised of an elastic insulating rubber body 25 and the same number of elastic conductive rubber pieces R1–R27 as that of the terminals P1–P27 embedded in the insulating rubber body 25 to correspond to the respective terminals P1–P27. The respective terminals P1–P27 are in elastic contact with one end of each of the conductive rubber pieces R1–R27. The display 9 has printed terminals S1–S27 which are exposed to the connector 24 and held in elastic contact with the other end of each of the coductive rubber pieces R1–R27. Under the condition where the openings 19–22 of the integrated circuit element 8 are engagingly received about the projections 27–30, the relative position of the integrated circuit element 8 is fixed in the sideward direction in FIG. 1 such that the respective terminals P1–P27 lie sandwiched between the film 10 and the rubber connector 24 without any displacement in the length of the integrated circuit element 8 (i.e., the sidward direction in FIG. 2). It is noted that the rubber connector 24 is springly received within a chamber 31 in the top casing 1 as defined by opposite side walls 32 and 33 so as not to allow displacement of the rubber connector 24 and the top casing 1 in the wideward direction.

An angle 14 is interposed between the display 9 and the integrated circuit element 8, which is generally an "L"-shaped member consisting of a horizontal segment 14a affixed to the rear of the display 9 and a vertical segment 14b held in contact with the terminal Pa. The display 9 is therefore secured by the use of the rubber connector 24 and the angle 14.

Although the terminals P1–P27, Q1–Q27, S1–S27 and the conductive rubber pieces R1–R27 are identical in number in the above illustrated embodiment, it is obvious to these skilled in the art that some of those components may be removed if desirable.

Figure 9:
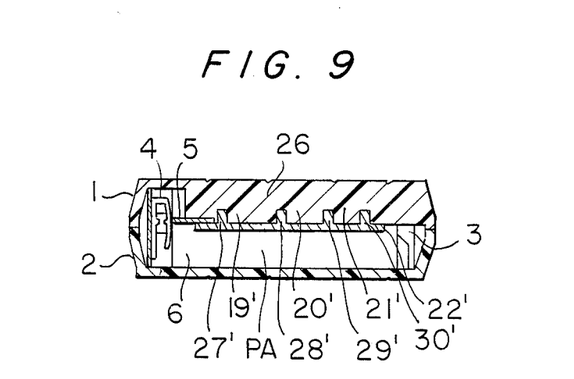
FIG. 9 is an alternate embodiment of the sectional view represented by FIG. 3.

In another embodiment of the present invention, projections 27', 28', 29' and 30' may be formed on the power terminal Pa of the integrated circuit element and openings 19', 20', 21' and 22' formed in the top casing 1. The openings (or projections) are formed in the package 17 of the integrated circuit element 8 and the projections (or openings) are respectively formed on the top casing 1 for placement of the integrated circuit element 8 with regard to the top casing 1.

Figure 7:
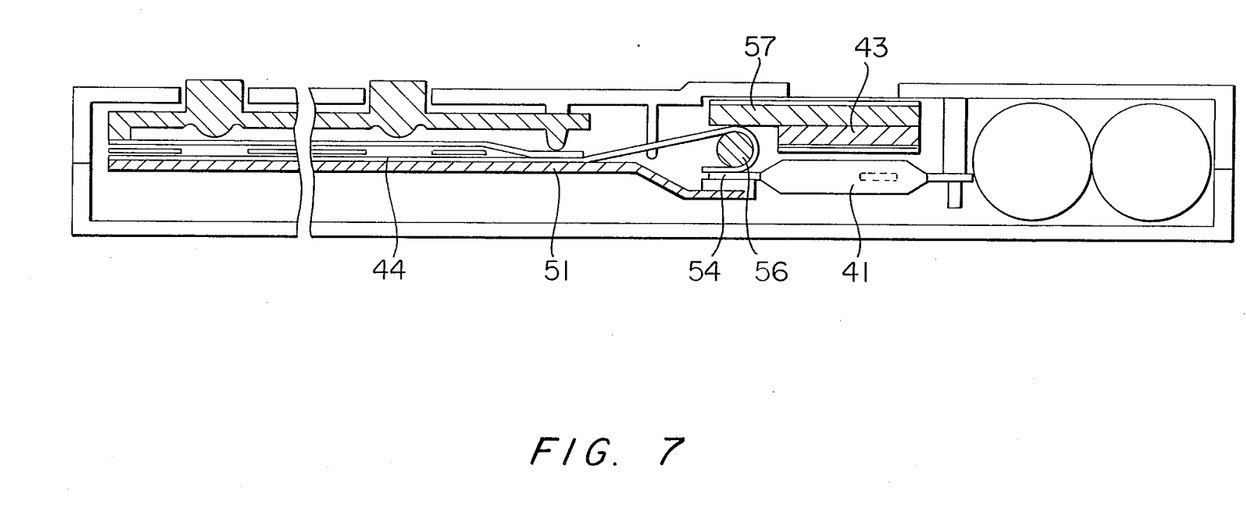
FIG. 7 is a cross sectional view of another embodiment of the present invention.
Figure 8:
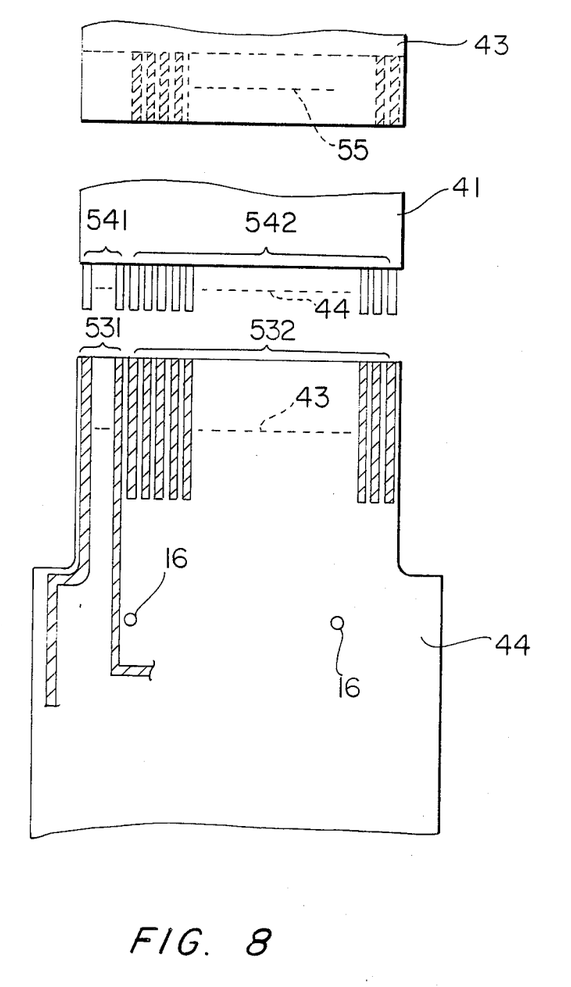
FIG. 8 is a plan view of the embodiment of FIG. 7 showing a liquid crystal display, a key wiring film and an integrated circuit element as principal components of a calculator.

FIGS. 7 and 8 show another embodiment of the present invention, showing a liquid crystal display panel 43, and LSI semiconductor element 41 and a key wiring film 44. The key wiring film 44 has a plurality of lead conductors 53 at one end thereof and the lead conductors 53 are grouped into key conductors and LSI connection conductors. There are two connection areas with one $53_1$ provided for connection between the conductors and key input lead terminals $54_1$ and the other $53_2$ provided for connection between lead-out terminals $54_2$ of the LSI element 41 for delivering display enable signals and lead-out terminals 55 of the liquid crystal display panel 43.

One end of the key wiring film 44 having the connection areas 53 is wound almost halfway about a cylindrical elastic rod 56 of electrically insulating rubber material which in turn is interposed between the lead terminals 54 of the LSI element 41 and a glass substrate 57 of the liquid crystal display element 43 with the aid of a press member 51. Accordingly, the connection areas are forced in pressure contact against the lead terminals 54 of the LSI element 41 and the lead terminals 55 of the liquid crystal display panel 43. The lead terminals $54_2$ of the LSI element 41 for outputting the display enable signals are electrically connected to the lead terminals 55 of the liquid crystal display panel 43. At the same time, the key wirings are electrically connected to the lead terminals $54_1$ of the LSI element 41.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A clock or watch assembly comprising:
   display means having external terminals;
   an integrated circuit element having a power terminal at one periphery thereof including a plurality of positioning apertures in said power terminal and a plurality of signal terminals opposite said power terminal at a second periphery thereof;
   a circuit board comprising a flexible film carrying a wiring pattern having a plurality of terminals to be electrically connected respectively to said signal terminals of said integrated circuit element and having a plurality of positioning apertures in said flexible film;

elastic engagement means comprising an electrically conductive material electrically and mechanically connecting said terminals of said display means and said wiring pattern of said circuit board with said signal terminals of said integrated circuit element; and a casing within which said integrated circuit element and said circuit board are securely fixed, said casing having a plurality of positioning projections to be received by said positioning apertures in said power terminal of said integrated circuit element and a plurality of positioning projections to be received by said positioning apertures in said circuit board, for determining the relative position of said integrated circuit element and said circuit board with respect to said casing, said plurality of positioning apertures of said integrated circuit element being formed asymmetrically with respect to a center line of said integrated circuit element, such that said terminals of said integrated circuit element electrically connected to said terminals on said circuit board are prevented from shifting from said connection by said projections of said casing received within said apertures in said integrated circuit element and said apertures in said circuit board.

2. A clock or watch assembly comprising:

display means having a plurality of terminals;

an integrated circuit element having a power terminal at one periphery thereof including a plurality of positioning projections on said power terminal and a plurality of signal terminals opposite said power terminal at a second periphery thereof;

a circuit board comprising a flexible film carrying a wiring pattern having a plurality of terminals to be electrically connected respectively to said terminals of said integrated circuit element and having a plurality of positioning apertures in said flexible film;

elastic engagement means comprising an electrically conductive material electrically and mechanically connecting said terminals of said display means and said wiring pattern of said circuit board with said signal terminals of said integrated circuit element; and a casing within which said integrated circuit element and said circuit board are securely fixed, said casing having a plurality of positioning apertures to receive said positioning projections on said power terminal of said integrated circuit element and a plurality of positioning projections to be received in said positioning apertures in said circuit board, for determining the relative position of said integrated circuit element and said circuit board with respect to said casing, said plurality of positioning projections of said integrated circuit element being formed asymmetrically with respect to a center line of said integrated circuit element, such that terminals of said integrated circuit element electrically connected to terminals on said circuit board are prevented from shifting from said connection by said apertures of said casing which receive said projections of said integrated circuit element and said projections of said casing which are received in said apertures of said circuit board.

3. A clock or watch assembly as set forth in claim 1, further including batteries for powering said integrated circuit element.

4. A clock or watch assembly comprising:

an integrated circuit element having a power terminal at one periphery thereof including a plurality of positioning projections on said power terminal and a plurality of signal terminals opposite said power terminal at a second periphery thereof;

a circuit board comprising a flexible film carrying a wiring pattern having a plurality of terminals to be electrically connected respectively to said signal terminals of said integrated circuit element and having a plurality of positioning apertures in said flexible film;

a casing within which said integrated circuit element and circuit board are securely fixed, said casing having a plurality of positioning apertures to receive said positioning projections on said power terminal of said integrated circuit element and a plurality of positioning projections to be received in said positioning apertures in said circuit board, for determining the relative position of said integrated circuit element and said circuit board with respect to said casing, said plurality of positioning projections of said integrated circuit element being formed asymmetrically with respect to a center line of said integrated circuit element; and a display means having a plurality of terminals to be electrically connected to said signal terminals of said integrated circuit element and held between said integrated circuit element and said casing, such that said terminals of said integrated circuit element electrically connected to said terminals on said circuit board and said terminals of said display means are prevented from shifting from said connections as a result of said projections of said integrated circuit element being received within said apertures of said casing and said projections of said casing being received within said apertures of said circuit board, said terminals of said display means being electrically connected to said signal terminals of said integrated circuit element by an elastic body around which one end of said circuit board is wound.

5. A clock or watch assembly as in claim 4, further including batteries for powering said integrated circuit element.

6. A clock or watch assembly comprising:

an integrated circuit element having a power terminal at one periphery thereof including a plurality of positioning apertures in said power terminal and a plurality of signal terminals opposite said power terminal at a second periphery thereof;

a circuit board comprising a flexible film carrying a wiring pattern having a plurality of terminals to be electrically connected respectively to said signal terminals of said integrated circuit element and having a plurality of positioning apertures in said flexible film;

a casing within which said integrated circuit element and said circuit board are securely fixed, said casing having a plurality of positioning projections to be received in said positioning apertures in said power terminal of said integrated circuit element and a plurality of positioning projections to be received in said positioning apertures in said circuit board, for determining the relative position of said integrated circuit element and said circuit board with respect to said casing, said plurality of positioning apertures of said integrated circuit element being formed asymmetrically with respect to a center line of said integrated circuit element; and a display means having a plurality of terminals to be electrically connected to said terminals of said integrated circuit element and held between said integrated circuit element and said casing, such that the terminals of said integrated circuit element electrically connected to the terminals on said circuit board and said terminals of said display means are prevented from shifting from said connections as a result of said projections of said casing being received in said apertures of said integrated circuit element and said circuit board, said terminals of said display means being electrically connected to said terminals of said integrated circuit element by an elastic body around which one end of said circuit board is wound.

7. A clock or watch assembly as in claim 6, further including batteries for powering said integrated circuit element.

8. A clock or watch assembly comprising:

display means having a plurality of terminals;

integrated circuit element having a power terminal at one periphery thereof and a plurality of signal terminals opposite said power terminal at a second periphery thereof;

a circuit board having a plurality of terminals being electrically connected respectively to said signal terminals of said integrated circuit element, said terminals of said display means also being electrically connected to said signal terminals of said integrated circuit element by an elastic body around which one end of said circuit board is wound.

9. The clock or watch assembly of claim 8, further including batteries for powering said integrated circuit element.

* * * * *